US006139339A

United States Patent [19]
Wu

[11] Patent Number: 6,139,339
[45] Date of Patent: Oct. 31, 2000

[54] COMPACT FLASH CARD CONNECTOR

[75] Inventor: Jerry Wu, Chang-Hua, Taiwan

[73] Assignee: Hon Hai Precision Ind. Co., Ltd., Taipei Hsien, Taiwan

[21] Appl. No.: 09/370,386

[22] Filed: Aug. 9, 1999

[51] Int. Cl.[7] .......... H10R 13/62
[52] U.S. Cl. .......... 439/159
[58] Field of Search .......... 439/159, 160, 439/64

[56] References Cited

U.S. PATENT DOCUMENTS

| | | | |
|---|---|---|---|
| 5,286,207 | 2/1994 | McHugh | 439/159 |
| 5,507,658 | 4/1996 | Ho | 439/159 |
| 5,667,396 | 9/1997 | Pan et al. | 439/160 |
| 5,713,750 | 2/1998 | Ho | 439/159 |
| 5,967,812 | 10/1999 | Tung et al. | 439/159 |
| 5,967,813 | 10/1999 | Ho et al. | 439/159 |

*Primary Examiner*—Gary F. Paumen
*Attorney, Agent, or Firm*—Wei Te Chung

[57] ABSTRACT

A compact flash card connector comprises a housing having a pair of guiding arms bridged by a cross bar and defining a receiving space therebetween. The cross bar has a mating face and a rear face opposite to the mating face and an array of passageways is defined between the mating and rear faces. An array of terminals is assembled in the array of passageways. A pair of guiding grooves is defined in inner walls of the arms for guiding an inserted card. An ejection plate is movably assembled to the arms and includes a pair of ejection tabs and a biasing tab extending downward into the receiving space. An ejecting arm is assembled to the cross bar for driving the ejection plate to move forward to eject an inserted card. An ejecting rod is assembled to one of the supporting arm for driving the ejecting arm. The ejecting rod includes a linkage interconnecting the ejecting rod and the ejecting arm. The ejecting rod includes a shoe moveably received in an elongate slot defined in an outer wall of the guiding arm.

13 Claims, 5 Drawing Sheets

COMPACT FLASH CARD CONNECTOR

FIELD OF THE INVENTION

The present invention relates to a connector, and more particularly to a lower profile compact flash card connector with simplified ejection mechanism.

DESCRIPTION OF PRIOR ART

Conventional card connector has a bulk size which is not suitable for compact application, such as digital camera and palm-top computer. In addition, the ejection mechanism assembled to the housing of the card connector is complicated thereby rendering a laborious assembly. However, the digital camera and palm-top computer do need a low profile card connector for additional memory or program to increase their capacity.

SUMMARY OF THE INVENTION

It is the objective of this invention to provide a compact flash card connector having a low profile and simple configuration for digital camera and palm-top computer application.

In order to achieve the objective set forth, a compact flash card connector in accordance with the present invention comprises a housing having a pair of guiding arms bridged by a cross bar and defining a receiving space therebetween. The cross bar has a mating face and a rear face opposite to the mating face and an array of passageways is defined between the mating and rear faces. An array of terminals is assembled in the array of passageways. A pair of guiding grooves is defined in inner walls of the arms for guiding an inserted card. An ejection plate is movably assembled to the arms and includes a pair of ejection tabs and a biasing tab extending downward into the receiving space. An ejecting arm is assembled to the cross bar for driving the ejection plate to move forward to eject an inserted card. An ejecting rod is assembled to one of the supporting arm for driving the ejecting arm. The ejecting rod includes a linkage interconnecting the ejecting rod and the ejecting arm. The ejecting rod includes a shoe moveably received in an elongate slot defined in an outer wall of the guiding arm.

According to one aspect of the present invention, a shaft is formed on a top face of the cross bar for rotatably mounting the ejection arm thereon by a shaft hole thereof. The shaft includes projections and the shaft hole includes cutouts corresponding to the projections. The projections will limit upward movement of the ejection arm when the projections and the cutouts are offset from each other.

These and additional objects, features, and advantages of the present invention will become apparent after reading the following detailed description of the preferred embodiments of the invention taken in conjunction with the appended drawing.

DETAILED DESCRIPTION OF PREFERRED EMBODIMENT

Figure 1:
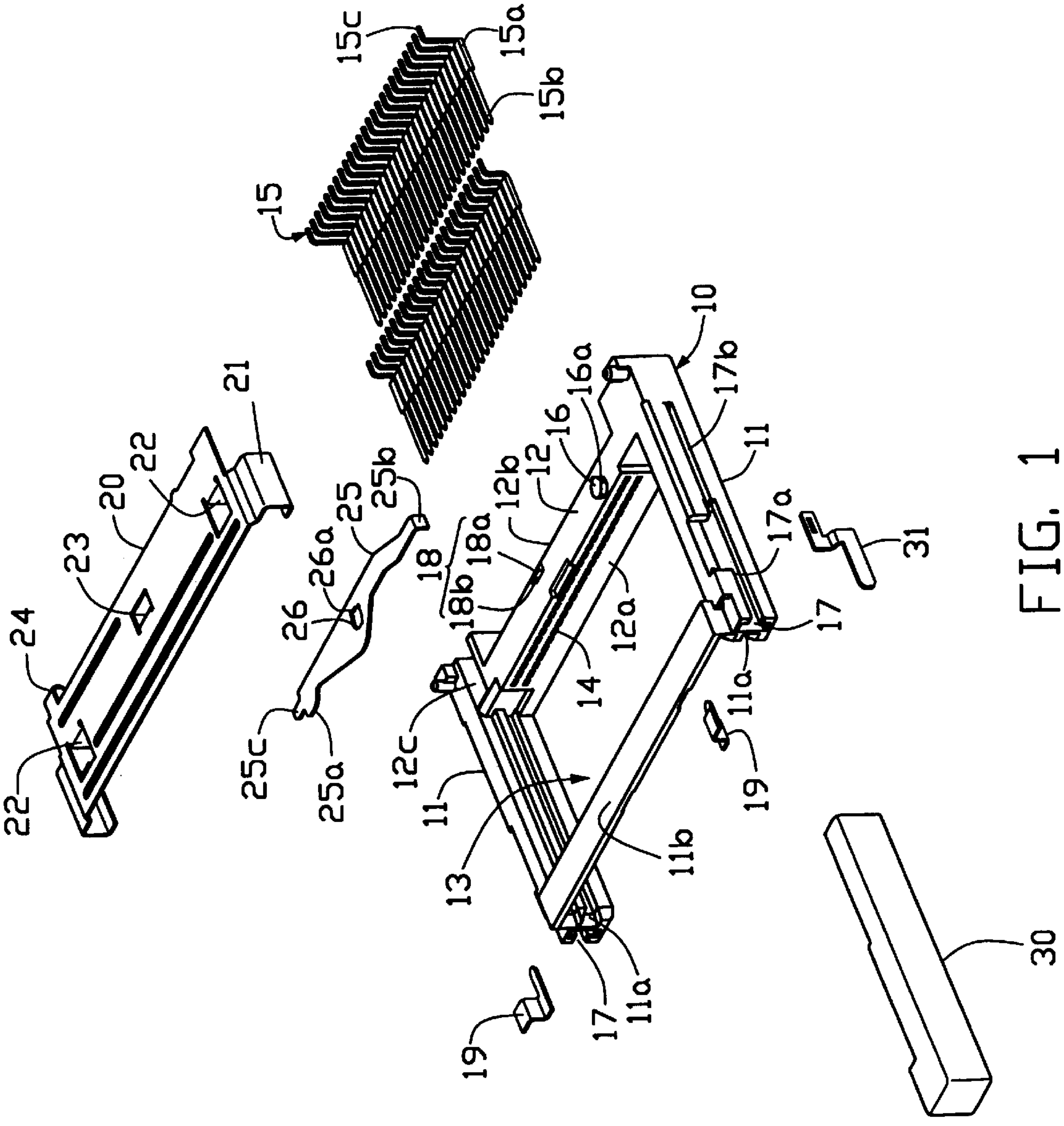
FIG. 1 is a perspective view of a compact flash card in accordance with the present invention.
Figure 2:
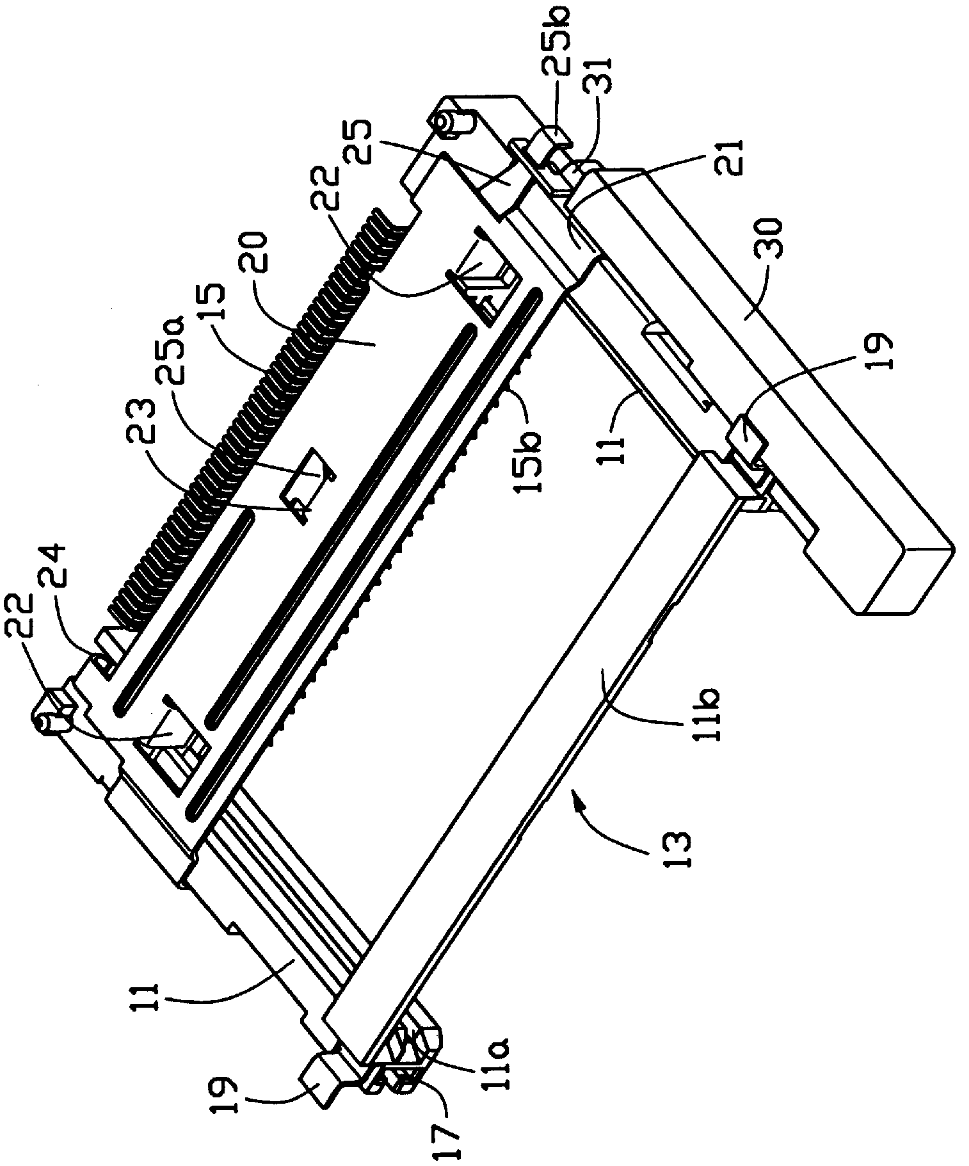
FIG. 2 is an assembled view with the ejection plate located in neutral position.
Figure 3:
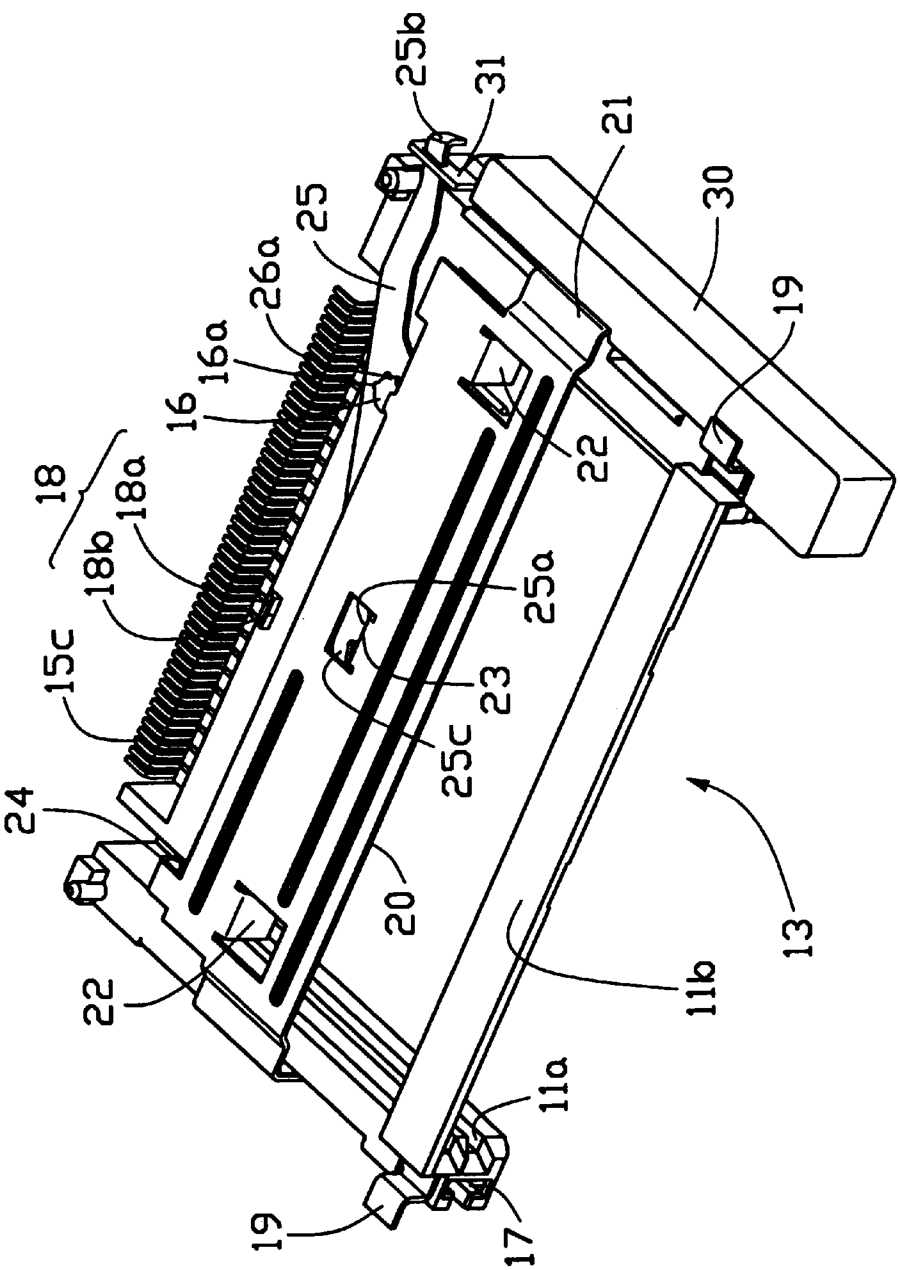
FIG. 3 is similar to FIG. 2 with an ejection plate located in ejected position.
Figure 4:
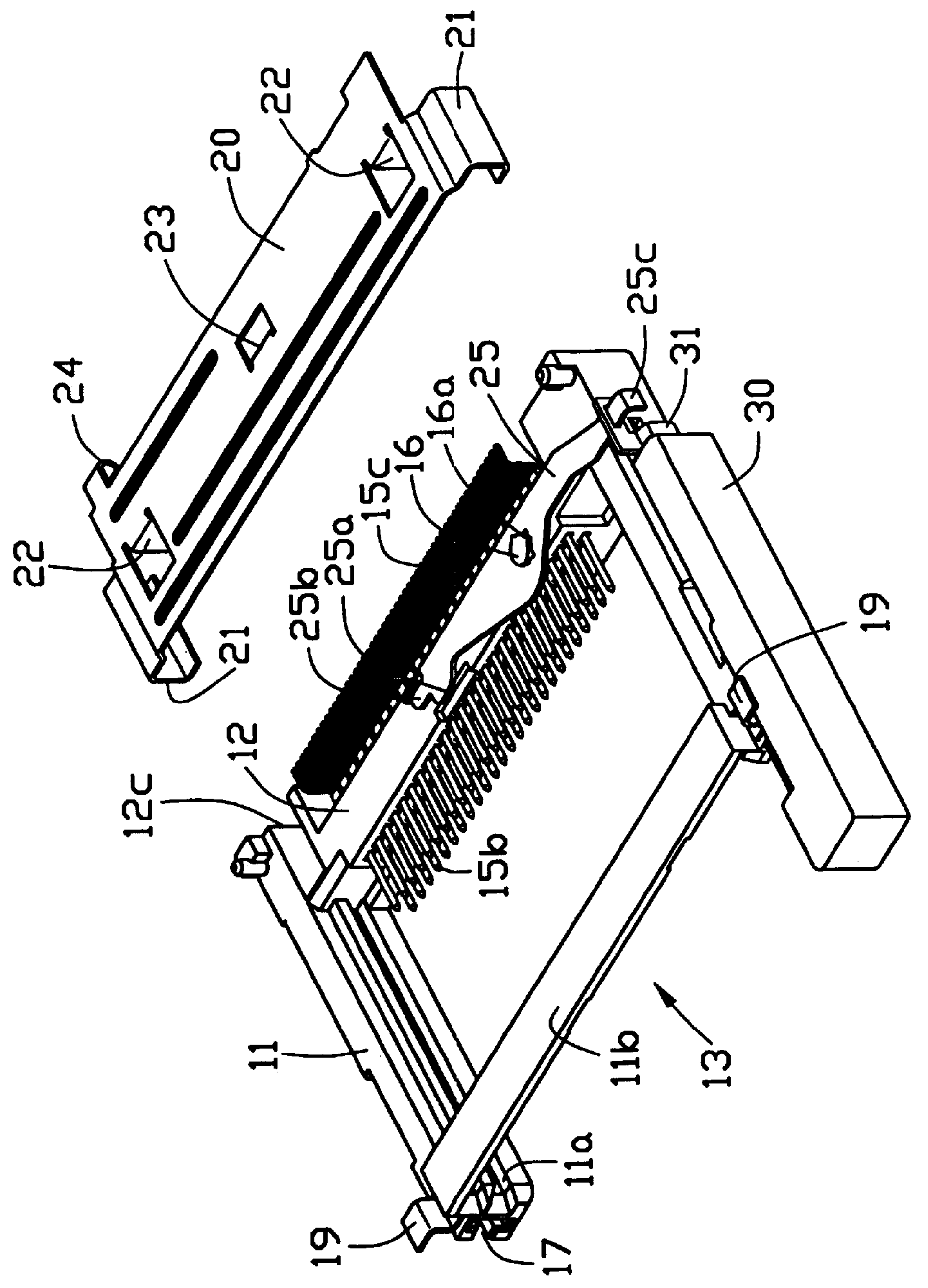
FIG. 4 is a perspective view with the ejection plate removed from the housing.
Figure 5:
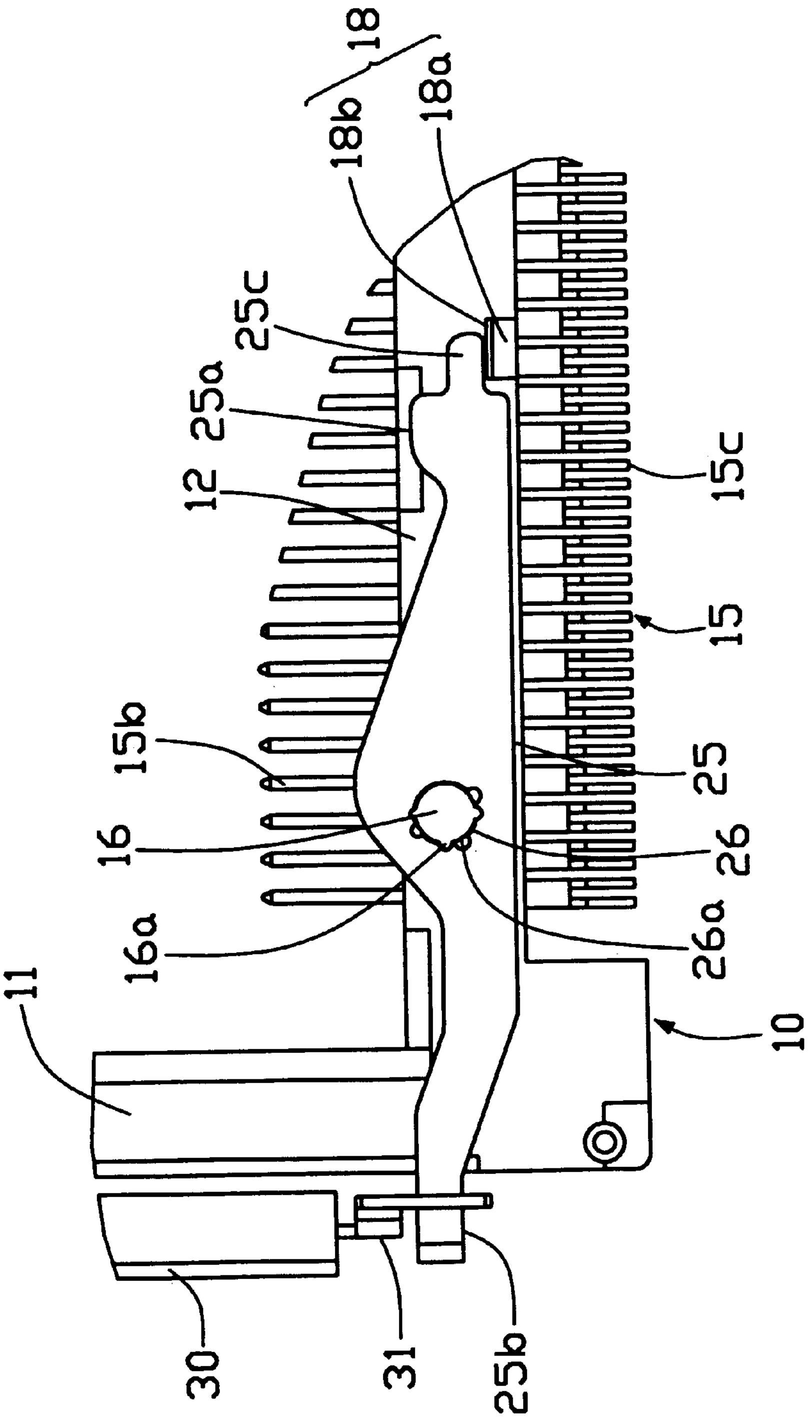
FIG. 5 is an enlarged, partial top plan view of FIG. 4, showing arrangement between an ejecting arm and a pivoting shaft formed on the housing.

Referring to FIGS. 1 to 5, a compact flash card connector 1 in accordance with the present invention comprises a housing 10 having a pair of guiding arms 11 bridged by a cross bar 12 and defining a receiving space 13 therebetween. The cross bar 12 has a mating face 12*a* and a rear face 12*b* opposite to the mating face 12*a*. The cross bar 12 forms a shaft 16 on a top face thereof. The shaft 16 includes a plurality of projections 16*a* extending radially from a top edge thereof. The cross bar 12 further forms a stop 18 on the top face thereof. The stop 18 includes an inclined face 18*a* and a vertical face 18*b*. An array of passageways 14 is defined between the mating and rear faces 12*a*, 12*b*. The cross bar 12 further defines a cutout 12*c*. The guiding arms 11 are bridged by a reinforced bar 11*b*.

An array of terminals 15 is assembled in said array of passageways 14 and each terminal 15 includes a base portion 15*a* fixedly assembled in said passageway 14, a mating portion 15*b* extending beyond said mating face 12*a*, and a tail portion 15*c*. The tail portions 15*c* are surface mounted to a printed circuit board (not shown). The guiding arms 11 each defines a guiding groove 11*a* for guiding an inserted card (not shown). The guiding arms 11 each further defines an outer guiding slot 17 at an outer wall thereof. The guiding slot 17 has a first section 17*a* having a T-shape section and a rear section 17*b*.

An ejection plate 20 is assembled to the rear sections 17*b* of the guiding arms 11. The ejection plate 20 includes a pair of wings 21 moveably received in the rear sections 17*b*. The ejection plate 20 further includes a pair of ejection tabs 22 and a biasing tab 23 extending downward into said receiving space 13. The ejection plate 20 further includes a stopper 24 which slides into the cutout 12*c* of the cross bar 12 during assembly. The stopper 24 will limit the forward movement of the ejection plate 20.

An ejecting arm 25 is rotationally assembled to the cross bar 12 for driving the ejection plate 20 to move forward along the arms 11. The ejecting arm 25 has a shaft hole 26 in a central portion thereof. The shaft hole 26 further defines three notches 26*a* corresponding to the projections 16*a* of the shaft 16 formed on the cross bar 12. The ejecting arm 25 includes a biasing point 25*a* for biasing against the biasing tab 23 of the ejection plate 20 and a connecting end 25*b*. In assembly, the notches 26*a* of the ejecting arm 25 are aligned with the projections 16*a* of the shaft 16 and then assembled thereto. The ejecting arm 25 is further rotated counterclockwise such that a front end 25*c* slides over the inclined face 18*a* of the stop 18. Afterward, clockwise rotation of the ejecting arm 25 is limited by the vertical surface 18*b* of the stop 18. In addition, the ejection arm 25 is parallel to the cross bar 12 of the housing 10.

An ejecting rod 30 is moveably assembled to one of the supporting arm 11 for driving the ejecting arm 25 which in turn moves the ejection plate 20. The ejecting rod 30 further includes a linkage 31 pivotably interconnecting the ejecting rod 30 and the ejecting arm 25. The ejecting rod 30 includes a T-shaped shoe (not shown) for moveably assembled to the T-shaped first section 17*a* of the guiding slot 17. When the ejecting rod 30 is interconnected to the ejection plate 20 through the linkage 31, the ejecting rod 30 is prevented from escaping from the corresponding arm 11.

When a card (not shown) is inserted, an edge of the card abuts against the ejection tabs 22 to push the ejection plate 20 backward till the card is electrically connected with the terminals 15. The biasing tab 23 in turn pushes the biasing point 25*a* backward thereby moving the ejection arm 25 to rotate clockwise and the ejecting rod 30 is then moved outward also. When the user wants to withdraw the inserted card and pushes the ejecting rod 30, the ejection arm 25 is then rotated counterclockwise thereby moving the ejection plate 20 outward to eject the inserted card by those pair of ejection tabs 22 of the ejection plate 20. In addition, since the ejection plate 20 is formed with a stopper 24, the forward movement will be stopped with the stopper 24 abuts an inner wall of the cutout 12*c*.

The connector 1 further includes a pair of solder pads 19 to be soldered onto the printed circuit board thereby the connector 1 is firmly supported thereon.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

I claim:

1. A compact flash card connector, comprising:

a housing having a pair of guiding arms bridged by a cross bar and defining a receiving space therebetween, said cross bar having a mating face and a rear face opposite to said mating face, an array of passageways defining between said mating and rear faces;

an array of terminals assembled in said array of passageways, each terminal including a base portion fixedly assembled in the respective passageway, a mating portion extending beyond said mating face, and a tail portion;

first guiding means formed in inner walls of said arms for guiding an inserted card;

an ejection plate assembled to said arms including a pair of ejection tabs and a biasing tab extending downward into said receiving space;

an ejecting arm assembled to said cross bar for driving said ejecting plate via said biasing tab to move along said arms;

an ejecting rod assembled to one of said guiding arms for driving said ejecting arm, said ejecting rod further including a linkage pivotably interconnecting said ejecting rod and said ejecting arm;

mounting means between said ejecting arm and said cross bar; and second guiding means between said ejection plate and said guiding arms.

2. The compact flash card connector as recited in claim 1, further comprising a reinforced bar bridged between front ends of said guiding arms.

3. The compact flash card connector as recited in claim 1, where in said mounting means includes a shaft formed on a top face of said cross bar, and a shaft hole on a central portion of said ejecting arm.

4. The compact flash card connector as recited in claim 3, wherein said shaft forms at least a projection extending outward from a top thereof.

5. The compact flash card connector as recited in claim 4, wherein said shaft hole further defines a notch corresponding to said projection of said shaft.

6. The compact flash card connector as recited in claim 5, wherein said cross bar further forms a stop on said top face thereof, said ejecting arm rotates over said stop during assembly and is limited by said stop for rotation thereover.

7. The compact flash card connector as recited in claim 1, wherein said first guiding means includes a pair of guiding grooves defined in inner walls of said guiding arms.

8. The compact flash card connector as recited in claim 1, wherein said second guiding means includes a pair of slots defined in outer wall of said guiding arms, and a pair of U-shape tabs on opposite ends of the ejecting plate.

9. The compact flash card connector as recited in claim 8, wherein each slot includes first and second sections.

10. The compact flash card connector as recited in claim 9, wherein said first section has a T-shape cross section.

11. The compact flash card connector as recited in claim 10, wherein said first section further defines a cutout.

12. The compact flash card connector as recited in claim 10, wherein said ejecting rod includes a T-shape shoe moveably received in said first section of said elongate slot.

13. A card connector comprising:

a housing having a pair of guiding arms bridged by a cross bar and defining a receiving space therebetween, said cross bar having a mating face and a rear face opposite to said mating face, an array of passageways defining between said mating and rear faces;

an array of terminals assembled in said array of passageways, each terminal including a base portion fixedly assembled in the respective, a mating portion extending beyond said mating face, and a tail portion;

first guiding means formed in inner walls of said arms for guiding an inserted card;

an ejection plate slidably assembled to said arms including a pair of ejection tabs and a biasing tab extending downward into said receiving space, second guiding means formed on the ejection plate and the guiding arms for guiding movement of the ejection plate therealong;

an ejecting arm pivotably assembled to said cross bar for driving said ejecting plate via said biasing tab to move along said arms, said ejecting arm being sandwiched between said ejection plate and said cross bar; and an ejecting rod slidably assembled to one of said guiding arms for driving said ejecting arm, said ejecting rod further including a linkage pivotably interconnecting said ejecting rod and said ejecting arm.

* * * * *